(12) United States Patent
Wu et al.

(10) Patent No.: US 7,888,302 B2
(45) Date of Patent: Feb. 15, 2011

(54) AQUEOUS BASED RESIDUE REMOVERS COMPRISING FLUORIDE

(75) Inventors: Aiping Wu, Macungie, PA (US); Roberto John Rovito, Quakertown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 1041 days.

(21) Appl. No.: 11/313,495

(22) Filed: Dec. 19, 2005

(65) Prior Publication Data

US 2006/0172906 A1    Aug. 3, 2006

Related U.S. Application Data

(63) Continuation-in-part of application No. 11/050,562, filed on Feb. 3, 2005, now Pat. No. 7,682,458.

(51) Int. Cl.
  *C11D 7/32* (2006.01)
(52) U.S. Cl. .................................. 510/175; 510/176
(58) Field of Classification Search .............. 510/175, 510/176
  See application file for complete search history.

(56) References Cited

U.S. PATENT DOCUMENTS

| | | |
|---|---|---|
| 4,171,242 A | 10/1979 | Liu |
| 4,824,763 A | 4/1989 | Lee |
| 5,320,709 A | 6/1994 | Bowden et al. |
| 5,417,877 A | 5/1995 | Ward |
| 5,556,833 A | 9/1996 | Howe |
| 5,571,447 A | 11/1996 | Ward et al. |
| 5,630,904 A | 5/1997 | Aoyama et al. |
| 5,676,760 A | 10/1997 | Aoki et al. |
| 5,698,503 A | 12/1997 | Ward et al. |
| 5,792,274 A | 8/1998 | Tanabe et al. |
| 5,905,063 A | 5/1999 | Tanabe et al. |
| 5,968,848 A | 10/1999 | Tanabe et al. |
| 5,972,862 A | 10/1999 | Torri et al. |
| 5,981,454 A | 11/1999 | Small |
| 6,117,783 A | 9/2000 | Small et al. |
| 6,162,301 A | 12/2000 | Zhang et al. |
| 6,358,663 B2 * | 3/2002 | Kimura et al. .............. 430/139 |
| 6,627,546 B2 | 9/2003 | Kneer |
| 6,641,986 B1 | 11/2003 | Zhang et al. |
| 6,677,286 B1 * | 1/2004 | Rovito et al. ................ 510/175 |
| 6,717,019 B2 | 4/2004 | Lassila |
| 6,821,352 B2 * | 11/2004 | Rovito et al. ................... 134/3 |
| 6,828,289 B2 | 12/2004 | Peters et al. |
| 7,427,362 B2 * | 9/2008 | Liu ............................ 252/79.1 |
| 2002/0055660 A1 | 5/2002 | Lassila et al. |
| 2003/0022800 A1 | 1/2003 | Peters et al. |
| 2003/0114014 A1 | 6/2003 | Yokoi et al. |
| 2004/0016904 A1 | 1/2004 | Baum |
| 2005/0236601 A1 * | 10/2005 | Liu et al. ................... 252/79.1 |
| 2007/0060490 A1 * | 3/2007 | Skee .......................... 510/175 |

FOREIGN PATENT DOCUMENTS

| | | |
|---|---|---|
| EP | 0 680 078 A | 11/1995 |
| EP | 0 827 188 | 3/1998 |
| EP | 0 901 160 | 3/1999 |
| JP | 6-83582 | 5/2003 |
| TW | 2004-02610 A | 2/2004 |
| WO | WO 98/30667 | 7/1998 |
| WO | 01/14510 A | 3/2001 |
| WO | 01/14510 A1 | 3/2001 |
| WO | 2004/037962 A | 5/2004 |

OTHER PUBLICATIONS

Patent and Trademark Office Board of Patent Appeals and Interferences, *Ex parte Breuer*, Mailed Jun. 30, 1986, Released Oct. 22, 1986, 1 USPQ2d, pp. 1906-1908.
The Merck Index, Eleventh Edition, MISC-113, 1989.
Roger Grant et al, Grant & Hackh's Chemical Dictionary, Fifth Edition, 1987, "buffer" p. 98.
Charles E. Mortimer, Chemistry A conceptual approach, Second Edition 1971, 16.7 "buffers", pp. 561-564.
USPTO Board of Appeals and Interferences, USPQ Second Series vol. 1, 1987, *Ex parte Breuer*, pp. 1906-1908.
John A. Dean, Lange's Handbook of Chemistry Fifteenth Edition, 1999, McGraw-Hill, Inc., pp. 8.110-8.113.
Daniel C. Harris, Quantitative Chemical Analysis Fifth Edition, W.H. Freeman and Co., NY, 1999, pp. 222-224.
Raymond E. Kirk et al, Encyclopedia of Chemical Technology vol. 7, The Interscience Encyclopedia New York, 1951, pp. 712-714.

* cited by examiner

*Primary Examiner*—Gregory E Webb
(74) *Attorney, Agent, or Firm*—Rosaleen P. Morris-Oskanian; Anne B. Kiernan

(57) ABSTRACT

A composition and method comprising same for selectively removing residues such as, for example, ashed photoresist and/or processing residues are disclosed herein. In one aspect, there is provided a composition for removing residue wherein the composition has a pH ranging from about 2 to about 9 comprising: a buffer solution comprising an organic acid and a conjugate base of the organic acid in a molar ratio of acid to base ranging from 10:1 to 1:10; a fluoride, and water, provided that the composition is substantially free of an added organic solvent. In another aspect, the composition may further comprise a corrosion inhibitor and/or a surfactant.

18 Claims, No Drawings

AQUEOUS BASED RESIDUE REMOVERS COMPRISING FLUORIDE

CROSS REFERENCE TO RELATED APPLICATIONS

This application is a continuation-in-part of U.S. patent application Ser. No. 11/050,562 filed Feb. 3, 2005 now U.S Pat. No. 7,682,458.

BACKGROUND OF THE INVENTION

Numerous steps are involved in the fabrication of microelectronic structures. Within the manufacturing scheme of fabricating integrated circuits selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered an important step in the integrated circuit fabrication process.

In the manufacture of semiconductors and semiconductor microcircuits, it is frequently necessary to coat substrate materials with a polymeric organic substance. Examples of some substrate materials includes, aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light. In subsequent processing steps, at least a portion of the photoresist is removed from the surface of the substrate. One common method of removing photoresist from a substrate is by wet chemical means. The wet chemical compositions formulated to remove the photoresist from the substrate should do so without corroding, dissolving, and/or dulling the surface of any metallic circuitry; chemically altering the inorganic substrate; and/or attacking the substrate itself. Another method of removing photoresist is by a dry ash method where the photoresist is removed by plasma ashing using either oxygen or forming gas such as hydrogen. The residues or by-products may be the photoresist itself or a combination of the photoresist, underlying substrate and/or etch gases. These residues or by-products are often referred to as sidewall polymers, veils or fences.

In many instances the plasma ash method leaves residues or by-products. Increasingly, reactive ion etching (RIE), is the process of choice for pattern transfer during via, metal line and trench formation. For instance, complex semi-conductor devices such as advanced DRAMS and microprocessors, which require multiple layers of back end of line interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al and Cu alloys, Cu, Ti, TiN, Ta, TaN, W, TiW, silicon or a silicide such as a silicide of tungsten, titanium or cobalt. The RIE process typically leaves a residue or a complex mixture that may include re-sputtered oxide material, organic materials from photoresist, and/or antireflective coating materials used to lithographically define the vias, metal lines and or trench structures.

It would therefore be desirable to provide a selective cleaning composition and process capable of removing residues such as, for example, remaining photoresist and/or processing residues, such as for example, residues resulting from selective etching using plasmas and/or RIE. Moreover, it would be desirable to provide a selective cleaning composition and process, capable of removing residues such as photoresist and etching residue, that exhibits high selectivity for the residue as compared to metals, high dielectric constant materials (referred to herein as "high-k"), silicon, silicide and/or interlevel dielectric materials including low dielectric constant materials (referred to herein as "low-k"), such as deposited oxides that might also be exposed to the cleaning composition. It would be desirable to provide a composition that is compatible with and can be used with such sensitive low-k films as HSQ, MSQ, FOx, black diamond and TEOS (tetraethylsilicate).

BRIEF SUMMARY OF THE INVENTION

The composition disclosed herein is capable of selectively removing residue such as processing residue from a substrate without attacking—to any undesired extent—metal, low-k dielectric, and/or high-k dielectric materials that might also be exposed to the composition. In one aspect, there is provided a composition for removing residues wherein the composition has a pH ranging from about 2 to about 9 comprising: a buffer solution comprising an organic acid and a conjugate base of the organic acid in a molar ratio of acid to base ranging from 10:1 to 1:10; a fluoride, and water, provided that the composition is substantially free of an added organic solvent. In another aspect, the composition may further comprise a corrosion inhibitor and/or surfactant.

Also disclosed herein is a method for removing residues including ashed photoresist and/or processing residue from a patterned substrate that comprises contacting an article with the above-disclosed composition.

DETAILED DESCRIPTION OF THE INVENTION

A composition and method comprising same for selectively removing residues such as, for example, ashed photoresist and/or processing residues are disclosed herein. In a cleaning method involving articles such as substrates useful for microelectronic devices, typical contaminants to be removed may include, for example, organic compounds such as exposed and ashed photoresist material, ashed photoresist residue, UV- or X-ray-hardened photoresist, C—F-containing polymers, low and high molecular weight polymers, and other organic etch residues; inorganic compounds such as metal oxides, ceramic particles from chemical mechanical planarization (CMP) slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching.

Moreover, the ashed photoresist and/or processing residues are typically present in an article that also includes metal, silicon, silicate and/or interlevel dielectric material such as deposited silicon oxides and derivatized silicon oxides such as HSQ, MSQ, FOX, TEOS and Spin-On Glass, and/or high-k materials such as hafnium silicate, hafnium oxide, barium strontium titanium (BST), $Ta_2O_5$, and $TiO_2$, wherein both the photoresist and/or residues and the metal, silicon, silicide, interlevel dielectric materials and/or high-k materials will come in contact with the cleaning composition.

In addition, the composition disclosed herein may exhibit minimal etch rates of certain dielectric materials such as silicon oxide. The composition and method disclosed herein provides for selectively removing residues without significantly attacking the metal, silicon, silicon dioxide, interlevel dielectric materials, and/or high-k materials. In one embodiment, the composition disclosed herein may be suitable for structures containing sensitive low k-films. In certain embodiments, the substrate may contain a metal, such as, but not limited to, copper, copper alloy, titanium, titanium nitride, tantalum, tantalum nitride, tungsten, and titanium/tungsten.

The composition disclosed herein comprises a buffer solution, a fluoride, and water. In certain embodiments, the composition is substantially free of, or contains 2% by weight or less, or 1% by weight or less of an added organic solvent. In certain embodiments, the composition is adjusted to a pH ranging from about 2 to about 9 and optionally includes a corrosion inhibitor and other additives that are typically used in compositions for removing ashed photoresist and/or processing residue. In one particular embodiment, the composition is comprised of an buffer solution in an amount necessary to obtain a composition with a pH ranging from 2 to 9; 80% by weight or greater of water; 0.001% by weight to 10% by weight of a fluoride; and up to 15% by weight of the optional corrosion inhibitor.

As mentioned previously, the composition described herein includes a buffer solution. The term "buffer solution" as used herein, is a solution that resists changes in pH as a result of small additions of acids or bases to the composition. The buffer solutions, when added to the compositions disclosed herein, provide a buffered composition with a pH adjusted to minimize corrosion of sensitive metals such as, for example, tungsten, copper, titanium, etc. The buffer solution is added in an amount that is necessary to obtain the desired pH range for the composition. The addition of the buffer solutions to the compositions disclosed herein prevents pH swings due to dilution with water or contamination by bases or acids.

The molar ratio of acid to its conjugate base in the buffer solution to provide such a buffering effect within the composition ranges from 10:1 to 1:10, or substantially 1:1 (i.e., equimolar concentration). The molar ratio of the buffer solution is adjusted as needed to attain the desired pH range of the composition. Buffers are typically thought of as weak acids and the widest buffering range against either an acid or a base is about one pH unit on either side of the pka of the weak acid group. Setting the pH for the buffer may be accomplished by having an molar ratio of acid to base ranging from 10:1 to 1:10 or substantially 1:1 of the acid and conjugate base for the acid (or in certain embodiments a protonated base) with the appropriate pka for the desired pH range.

The buffer solution contains an organic acid and its conjugate base. Exemplary organic acids include acetic acid, phosphoric acid, and benzoic acid. In certain embodiments, the organic acid within the buffer solution may also be present in the composition as the corrosion inhibitor and/or chelating agent. Exemplary conjugate bases include ammonium salts and amine salts. Further examples of the conjugate bases include hydroxylamines, organic amines such as primary, secondary or tertiary aliphatic amines, alicyclic amines, aromatic amines and heterocyclic amines, aqueous ammonia, and lower alkyl quaternary ammonium hydroxides. Specific examples of the hydroxylamines include hydroxylamine ($NH_2OH$), N-methylhydroxylamine, N,N-dimethylhydroxylamine and N,N-diethylhydroxylamine. Specific examples of the primary aliphatic amines include monoethanolamine, ethylenediamine and 2-(2-aminoethylamino)ethanol. Specific examples of the secondary aliphatic amines include diethanolamine, N-methylaminoethanol, dipropylamine and 2-ethylaminoethanol. Specific examples of the tertiary aliphatic amines include dimethylaminoethanol and ethyldiethanolamine. Specific examples of the alicyclic amines include cyclohexylamine and dicyclohexylamine. Specific examples of the aromatic amines include benzylamine, dibenzylamine and N-methylbenzylamine. Specific examples of the heterocyclic amines include pyrrole, pyrrolidine, pyrrolidone, pyridine, morpholine, pyrazine, piperidine, N-hydroxyethylpiperidine, oxazole and thiazole. Specific examples of the lower alkyl quaternary ammonium salts include tetramethylammonium hydroxide (TMAH), tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide and (1-hydroxypropyl)trimethylammonium hydroxide. Among these bases, aqueous ammonia, monoethanolamine, N-methylaminoethanol, tetramethylammonium hydroxide and (2-hydroxyethyl)trimethylammonium hydroxide are preferable from availability and safety standpoints. The conjugate bases may be used either alone or in combination with one another.

Exemplary buffer solutions may include acetic acid/acetate salts, benzoic acid/benzoate salts, and phenolic acid/phenolate salts. In one embodiment, the buffer solution is an aqueous solution of ammonium acetate and acetic acid. In this particular embodiment, the amount of ammonium acetate that is added to the composition may range from about 1% by weight to about 10% by weight or from about 2% by weight to about 8% by weight; the amount of acetic acid that is added to the composition may range from about 0.1% by weight to about 10% by weight or from about 0.1% by weight to about 5% by weight. In yet another embodiment, the buffer solution is benzoic acid and ammonium benzoate.

In certain embodiments, a pH ranging from about 2 to about 9, or ranging from about 3 to about 7, or ranging from about 5 to about 6 will allow most sensitive metals to passivate with minimum corrosion. In certain embodiments, compositions that are used for the removal of highly inorganic etch residues and oxide skimming may require a slightly acidic pH (i.e., ranging from 5 to 6). In another embodiment, the pH of the composition may be adjusted to a range of from about 2 to about 7 to clean etch residue and passivate metals.

Fluoride is present in the compositions described herein. Fluoride-containing compounds include those of the general formula $R_1R_2R_3R_4NF$ where $R_1$, $R_2$, $R_3$, and $R_4$ are independently hydrogen, an alcohol group, an alkoxy group, an alkyl group or mixtures thereof. Examples of such compounds include ammonium fluoride, tetramethyl ammonium fluoride, tetraethyl ammonium fluoride, tetrabutyl ammonium fluoride, choline fluoride, and mixtures thereof. Still further examples of fluorides include fluoroboric acid, hydrofluoric acid, and choline fluoride. The fluoride is preferably present in amounts of from 0.001% by weight to 10% by weight or from 0.1% by weight to 5% by weight. In certain embodiments, the fluoride is added to the composition in the form of a fluoride salt, such as, for example, ammonium fluoride. In this embodiment, ammonium fluoride may be available commercially as a 40% aqueous solution.

As mentioned previously, water is also present in the composition disclosed herein. It can be present incidentally as a component of other elements, such as for example, an aqueous ammonium fluoride solution or an aqueous buffer solution, or it can be added separately. Some non-limiting examples of water include deionized water, ultra pure water, distilled water, doubly distilled water, or deionized water having a low metal content. Preferably, water is present in amounts of about 80% by weight or greater or about 85% by weight or greater, or about 90% by weight or greater.

The compositions of the present disclosure can also optionally contain up to about 15% by weight, or about 0.2 to about 10% by weight of a corrosion inhibitor. Any corrosion inhibitor known in the art for similar applications, such as those disclosed in U.S. Pat. No. 5,417,877 which are incorporated herein by reference may be used. Corrosion inhibitors may be, for example, an organic acid, an organic acid salt, a phenol, a triazole, a hydroxylamine or acid salt thereof. Examples of particular corrosion inhibitors include citric acid, anthranilic acid, gallic acid, benzoic acid, isophthalic acid, maleic acid, fumaric acid, D,L-malic acid, malonic acid, phthalic acid, maleic anhydride, phthalic anhydride, benzotriazole (BZT), resorcinol, carboxybenzotriazole, diethyl hydroxylamine and the lactic acid and citric acid salts thereof, and the like. Further examples of corrosion inhibitors that may be used include catechol, pyrogallol, and esters of gallic acid. Particular hydroxylamines that can be used include diethylhydroxylamine and the lactic acid and citric acid salts thereof. Yet other examples of suitable corrosion inhibitors include fructose, ammonium thiosulfate, glycine, lactic acid, tetramethylguanidine, iminodiacetic acid, and dimethylacetoacetamide. In certain embodiments, the corrosion inhibitor may include a weak acid having a pH ranging from about 4 to about 7. Examples of weak acids include trihydroxybenzene, dihydroxybenzene, and/or salicylhydroxamic acid. In embodiments wherein the corrosion inhibitor is an organic acid, the organic acid may be the same as that used in the buffer solution.

The composition may also include one or more of the following additives: surfactants, chelating agents, chemical modifiers, dyes, biocides, and other additives. The additive(s) may be added to the extent that they do not adversely affect the pH range of the composition. Some examples of representative additives include acetylenics alcohols and derivatives thereof, acetylenics diols (non-ionic alkoxylated and/or self-emulsifiable acetylenics diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, malic acid and tartaric acid based esters and diesters and derivatives thereof, and tertiary amines, diamines and triamines. In certain embodiments, the carboxylic acid that may be added to the composition in the buffer solution may also act as a chelating agent within the composition. Specific acetylinic diols include Surfynol 465 surfactant available from Air Products and Chemicals, Inc., Allentown, Pa., USA. Surfynol 465 is 2,4,7,9-tetramethyl-5-decyn-4,7-diol, which is ethoxylated with 10 ethylene oxide units. See U.S. Pat. No. 6,717,019 at column 9, line 46.

Materials removed with the compositions described herein include ashed photoresists and processing residues known in the art by such names as sidewall polymers, veils, fences etch residue, ash residue and the like. In certain preferred embodiments, the photoresist is exposed, developed, etched and ashed prior to contact with the composition described herein. The compositions disclosed herein are compatible with low-k films such as HSQ (FOx), MSQ, SiLK, etc. The formulations are also effective in stripping ashed photoresists including positive and negative photoresists and plasma etch residues such as organic residues, organometallic residues, inorganic residues, metallic oxides, or photoresist complexes at low temperatures with very low corrosion of tungsten, copper, titanium containing substrates. Moreover, the compositions are also compatible with a variety of high dielectric constant materials.

During the manufacturing process, a photoresist layer is coated on the substrate. Using photolithographic process, a pattern is defined on the photoresist layer. The patterned photoresist layer is thus subjected to plasma etch by which the pattern is transferred to the substrate. Etch residues are generated in the etch stage. The patterned substrate is subsequently ashed to form a residue. When the substrates are ashed, the main residues to be cleaned are etchant residues.

The method described herein may be conducted by contacting a substrate having an organic or metal-organic polymer, inorganic salt, oxide, hydroxide, or complex or combination thereof present as a film or residue, with the described composition. The actual conditions, e.g. temperature, time, etc. depend on the nature and the thickness of the material to be removed. In general, the substrate is contacted or dipped into a vessel containing the composition at a temperature ranging from 20° C. to 80° C., or from 20° C. to 60° C., or from 20° C. and 40° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein.

The following examples are provided to further illustrate the composition and method disclosed herein. Examples of the various exemplary and comparative (comp.) compositions and pH levels for each composition are set forth in Table I. In Table I, all amounts are given in weight percent and add up to 100 weight percent. The compositions disclosed herein were prepared by mixing the components together in a vessel at room temperature until all solids have dissolved. In the examples below, pH determinations were made using 5% aqueous solutions at ambient temperature. The substrates were coated with a positive resist that was developed, etched and ashed prior to exposure prior to exposure to the composition. Unless stated otherwise, the wafers had a copper patterned layer. In the following tables, "N.T." indicates not tested.

The summary of cleaning data, along with the exposure temperature and time, are provided in Table II. In this procedure, one or more test wafers were placed in a 600 milliliter (ml) beaker that contained 400 ml of each exemplary composition. The 600 ml beaker further included a 1" stir bar that rotated at 400 revolutions per minute. The exemplary compositions having the wafer(s) contained therein were then heated at the time and temperature provided in Table II. After exposure to the exemplary composition, the wafer(s) were rinsed with deionized water and dried with nitrogen gas. The wafers were cleaved to provide an edge then examined using scanning electron microscopy (SEM) on a variety of predetermined locations on the wafer and the results were visually interpreted and coded as provided in the following manner: "+++" indicates excellent; "++" indicates good; "+" indicates fair; and "−" indicates poor. Some of the results provided in Table II were not available (N/A) due to the difficulty in obtaining a prior cleave that showed the copper patterned layer.

The summary of etch rates ("ER") are provided in Table II. In all of the following etch rates, measurements were conducted at 5, 10, 20, 40, and 60 minutes of exposure. Thickness measurements were determined at each time interval and graphed using a "least squares fit" model on the results for each exemplary composition. The calculated slope of the "least squares fit" model of each composition is the resultant etch rate provided in angstroms/minute (Å/min). In determining the metal etch rate, the wafers had a blanker layer of a known thickness deposited upon it. The initial thickness of the wafer was determined using the CDE ResMap 273 Four Point Probe. After determining the initial thickness, test wafers were immersed in the exemplary compositions. After five minutes, the test wafers were removed from the test solution, rinsed for three minutes with deionized water and completely dried under nitrogen. The thickness of each wafer was measured, and if necessary, the procedure was repeated on the test wafer.

The oxide etch rates were obtained from a substrate having a layer of silicon dioxide. Oxide etch rates were determined using a Nanospec AFT 181. A quantity of 200 ml of a test solution was placed in a 250 ml beaker with stirring and heated, if required, to the specified temperature. Three circles were scribed on each of the wafers to be tested. The marked areas on each wafer were the areas in which measurements would be taken. Initial measurements of each wafer were taken. After the initial measurements the wafers were immersed in the test solution for five minutes. If only one wafer was placed in a beaker containing solution a dummy wafer was placed in the beaker. After five minutes, the test wafer was washed with deionized water for three minutes, and dried under nitrogen. Measurements of the scribed areas on each wafer were taken and if necessary the procedure was repeated.

The CORAL™ etch rates were performed using silicon wafer having a CORAL™ organosilicate film deposited thereupon. The CORAL™ etch rates were obtained on an elliposometer that was operated in the same manner as the Nanospec AFT described above for obtaining oxide etch rates.

TABLE I

| EXAMPLE | Deionized Water | Ammonium Acetate | Ammonium Fluoride (40% Aq. Solution) | Acetic Acid | pH |
|---|---|---|---|---|---|
| Example 1 | 93 | 4.3 | 1.5 | 1.2 | 5.1 |
| Example 2 | 92.5 | 4.3 | 2 | 1.2 | N.T. |
| Example 3 | 92 | 4.3 | 2.5 | 1.2 | N.T. |
| Example 4 | 91 | 4.3 | 3.5 | 1.2 | N.T. |
| Example 5 | 89.5 | 4.3 | 5 | 1.2 | N.T. |
| Example 6 | 93.5 | 4.3 | 1 | 1.2 | 5.2 |
| Example 7 | 95.7 | 1.6 | 1.5 | 1.2 | N.T. |
| Example 8 | 93.6 | 4.3 | 1.5 | 0.6 | 5.5 |
| Example 9 | 94.1 | 4.3 | 1 | 0.6 | 5.3 |
| Example 10 | 93.9 | 4.3 | 1.5 | 0.3 | 5.7 |
| Example 11 | 89.3 | 8.6 | 1.5 | 0.6 | 5.8 |
| Example 12 | 89.2 | 8.6 | 1 | 1.2 | 5.6 |
| Comp. Ex. 1 | 94.5 | 4.3 | 0 | 1.2 | 5.1 |
| Comp. Ex. 2 | 97 | 0 | 1.5 | 1.2 | N.T. |
| Comp. Ex. 3 | 94.2 | 4.3 | 1.5 | 0 | 7 |
| Comp. Ex. 4 | 94.7 | 4.3 | 1 | 0 | 6.7 |
| Comp. Ex. 5 | 95.2 | 4.3 | 0.5 | 0 | 6.6 |
| Comp. Ex. 6 | 98.5 | 0 | 1.5 | 0 | 6.9 |

TABLE II

| EXAMPLE | Temp. (° C.) | Time (min.) | Etched and Ashed Photoresist Residue | Cu attack |
|---|---|---|---|---|
| Ex. 1, test a | 40 | 2 | ++ | ++ |
| Ex. 1, test b | 25 | 2 | − | − |
| Ex. 2 | 40 | 2 | ++ | ++ |
| Ex. 3 | 40 | 2 | ++ | ++ |
| Ex. 4 | 40 | 2 | ++ | − |
| Ex. 5 | 40 | 2 | ++ | − |
| Ex. 6, test a | 40 | 2 | ++ | ++ |
| Ex. 6, test b | 45 | 2 | ++ | N/A |
| Ex. 6, test c | 50 | 2 | + | N/A |
| Ex. 7 | 40 | 2 | + | ++ |
| Ex. 8 | 40 | 2 | ++ | ++ |
| Ex. 9 | 40 | 2 | + | N/A |
| Ex. 10 | 40 | 2 | + | N/A |
| Ex. 11 | 40 | 2 | + | N/A |
| Ex. 12 | 40 | 2 | + | N/A |
| Comp. Ex. 1 | 40 | 2 | − | N/A |
| Comp. Ex. 2 | 40 | 2 | + | ++ |
| Comp. Ex. 3, test a | 40 | 2 | +++ | − |
| Comp. Ex. 3, test b | 30 | 2 | − | N/A |
| Comp. Ex. 3 c, test c | 35 | 2 | + | N/A |
| Comp. Ex. 4 | 40 | 2 | ++ | N/A |
| Comp. Ex. 5 | 40 | 2 | + | N/A |
| Comp. Ex. 6 | 40 | 2 | − | N/A |

TABLE III

| EXAMPLE | Temp. (° C.) | Cu ER (Å/min.) | Oxide ER (Å/min.) | CORAL ™ ER (Å/min.) |
|---|---|---|---|---|
| Ex. 1, test a | 40 | 4.46 | 0.28 | 0.04 |
| Ex. 1, test b | 25 | 2 | 0.14 | 0.13 |
| Ex. 2 | 40 | N.T. | N.T. | N.T. |
| Ex. 3 | 40 | N.T. | N.T. | N.T. |
| Ex. 4 | 40 | N.T. | N.T. | N.T. |
| Ex. 5 | 40 | N.T. | N.T. | N.T. |
| Ex. 6, test a | 40 | 3.35 | N.T. | N.T. |
| Ex. 6, test b | 25 | N.T. | N.T. | N.T. |
| Ex. 6, test c | 50 | 10.36 | N.T. | N.T. |
| Ex. 7 | 40 | N.T. | N.T. | N.T. |
| Ex. 8 | 40 | 4.33 | N.T. | N.T. |
| Ex. 9 | 40 | 12 | N.T. | N.T. |
| Ex. 10 | 40 | N.T. | N.T. | N.T. |
| Ex. 11 | 40 | 7 | N.T. | N.T. |
| Ex. 12 | 40 | 8.7 | N.T. | N.T. |
| Comp. Ex. 1 | 40 | N.T. | N.T. | N.T. |
| Comp. Ex. 2 | 40 | N.T. | N.T. | N.T. |
| Comp. Ex. 3, test a | 40 | N.T. | N.T. | N.T. |
| Comp. Ex. 3, test b | 30 | 12.83 | N.T. | N.T. |
| Comp. Ex. 3, test c | 25 | N.T. | N.T. | N.T. |
| Comp. Ex. 4 | 40 | 18.47 | N.T. | N.T. |
| Comp. Ex. 5 | 40 | 17.7 | N.T. | N.T. |
| Comp. Ex. 6 | 40 | 20.2 | N.T. | N.T. |

The formulation of Example 1 was modified to include citric acid as the corrosion inhibitor and Surfynol 465 as a nonionic acetylinic diol surfactant; this formulation is reported in Table IV, below as Example 13. The etch rates for Ex. 13 were compared to Ex. 1 for various metals and dielectric substrates, as reported in Table V. Ex. 13 showed comparable etch rates for most substrates tested and improved avoidance of etch rate for titanium. The technique for generating the data in Table V was the same as that which was described for the data in Table III above.

TABLE IV

| | Formulation Information | | | | | | |
|---|---|---|---|---|---|---|---|
| | Deionized Water | Ammonium Acetate | Ammonium Fluroide (40% Aq. Solution) | Acetic acid | Citric acid (29% Aq. Solution) | Surfynol 465 | pH |
| Ex 13 | 89.14 | 4 | 0.95 | 4 | 1.9 | 0.01 | 4.69 |

TABLE V

Etch Rate Data Of Example 1 And Example 13

| | Temperature (° C.) | Cu | Ti | W | TiN | Ta | TaN | TiW | Thermal Oxide | SiN | TEOS* |
|---|---|---|---|---|---|---|---|---|---|---|---|
| Example 1 | 25 | 1 | <1 | <1 | <1 | <1 | <1 | 1 | <1 | <1 | 8 |
| | 40 | 2 | 27 | <1 | <1 | <1 | <1 | 1 | <1 | <1 | 15 |
| Example 13 | 25 | 1 | <1 | <1 | <1 | <1 | <1 | <1 | <1 | 2 | 10 |
| | 40 | 2 | 15 | 1 | 2 | <1 | <1 | 2 | 1 | 5 | 24 |

*TEOS, doped, undensify

The invention claimed is:

1. A composition for removing residue wherein the composition has a pH ranging from about 2 to about 9, the composition comprising:
   a buffer solution comprising an acid and a conjugate base of the acid in a molar ratio of acid to base ranging from 10:1 to 1:10 and wherein the acid is at least one selected from acetic acid, phosphoric acid, benzoic acid, phenolic acid, and mixtures thereof and wherein the conjugate base of the acid is at least one selected from ammonium acetate, an ammonium salt of phosphoric acid, a benzoic salt, a phenolate salt, and mixtures thereof;
   a fluoride, and
   water,
   provided that the composition is substantially free of an added organic solvent.

2. The composition of claim 1 further comprising a corrosion inhibitor.

3. The composition of claim 2 wherein the corrosion inhibitor is at least one selected from citric acid, anthranilic acid, gallic acid, benzoic acid, malonic acid, maleic acid, fumaric acid, D,L-malic acid, isophthalic acid, phthalic acid, lactic acid, maleic anhydride, phthalic anhydride, catechol, pyrogallol, esters of gallic acid, benzotriazole, carboxybenzotriazole, fructose, ammonium thiosulfate, glycine, tetramethylguanidine, iminodiacetic acid, dimethylacetoacetamide, thioglycerol, trihydroxybenzene, dihydroxybenzene, salicylhydroxamic, and mixtures thereof.

4. The composition of claim 1 wherein the fluoride has a composition of the general formula $R_1R_2R_3R_4NF$ where $R_1, R_2, R_3$ and $R_4$ are independently hydrogen, an alcohol group, an alkoxy group, an alkyl group and mixtures thereof.

5. The composition of claim 4 wherein the fluoride is selected from ammonium fluoride, tetramethyl ammonium fluoride, tetraethyl ammonium fluoride, tetrabutyl ammonium fluoride, choline fluoride, and mixtures thereof.

6. The composition of claim 1 wherein the fluoride is fluoroboric acid.

7. The composition of claim 1 wherein the acid within the buffer solution comprises acetic acid and wherein the conjugate base within the buffer solution comprises ammonium acetate.

8. The composition of claim 1 wherein the acid within the buffer solution comprises phosphoric acid and wherein the conjugate base within the buffer solution comprises an ammonium salt of phosphoric acid.

9. The composition of claim 1 wherein the molar ratio is substantially 1:1.

10. A method of removing residue from a substrate comprising: applying a composition according to claim 1 to the substrate at a temperature of from 20° C. to 80° C. for a period of time sufficient to remove the residue from the substrate.

11. The method as claimed in claim 10, wherein the temperature is from 20° C. to 60° C.

12. A method for defining a pattern comprising:
    coating a photoresist onto at least a portion of the substrate;
    lithographically defining a pattern on the photoresist;
    transferring the pattern onto at least a portion of the substrate;
    etching the pattern into the substrate to form a patterned substrate
    heating the patterned substrate to a temperature sufficient to ash the photoresist and provide a residue; and
    removing the residue by contacting the patterned substrate with a composition comprising: an buffer solution comprising an organic acid and a conjugate base of the organic acid in a molar ratio of acid to conjugate base ranging from 10:1 to 1:10; a fluoride; and water, wherein the composition has a pH ranging from about 2 to about 9 and the composition is substantially free of an added organic solvent.

13. A composition for removing residue wherein the composition has a pH ranging from about 2 to about 9, the composition comprising:
    a buffer solution comprising an organic acid and a conjugate base of the organic acid in a molar ratio of acid to base ranging from 10:1 to 1:10;
    a fluoride,
    water,
    a corrosion inhibitor, and
    a surfactant,
    provided that the composition is substantially free of an added organic solvent.

14. A composition for removing residue wherein the composition has a pH ranging from about 2 to about 9, the composition comprising:
    a buffer solution comprising acetic acid and ammonium acetate in a molar ratio of acid to base ranging from 10:1 to 1:10;
    ammonium fluoride,
    water,
    a corrosion inhibitor comprising citric acid, and
    an ethoxylated acetylenic diol surfactant,
    provided that the composition is substantially free of an added organic solvent.

15. A composition for removing residue wherein the composition has a pH ranging from about 2 to 7, the composition comprising:
    a buffer solution comprising an organic acid and a conjugate base of the organic acid in a molar ratio of acid to base ranging from 10:1 to 1:10;
    a fluoride, and
    80% by weight or greater of water,
    provided that the composition is substantially free of an added organic solvent.

16. The composition of claim 15 further comprising a corrosion inhibitor.

17. The composition of claim 15 further comprising a surfactant.

18. The composition of claim 17 wherein the surfactant comprises an ethoxylated acetylenic diol surfactant.

* * * * *